United States Patent
Despont et al.

(10) Patent No.: US 6,949,397 B2
(45) Date of Patent: Sep. 27, 2005

(54) FABRICATION OF SILICON MICRO MECHANICAL STRUCTURES

(75) Inventors: Michel Despont, Adliswil (CH); Roy H. Magnuson, Endicott, NY (US); Ute Drechsler, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 10/466,516
(22) PCT Filed: Jan. 11, 2002
(86) PCT No.: PCT/IB02/00154
 § 371 (c)(1),
 (2), (4) Date: Jan. 30, 2004
(87) PCT Pub. No.: WO02/057179
 PCT Pub. Date: Jul. 25, 2002

(65) Prior Publication Data
US 2004/0135219 A1 Jul. 15, 2004

(30) Foreign Application Priority Data
Jan. 18, 2001 (EP) .......................... 01810046

(51) Int. Cl.$^7$ .............................................. H01L 21/00
(52) U.S. Cl. ................... 438/52; 438/686; 438/48; 438/50; 438/678; 438/745; 438/753; 438/754
(58) Field of Search ..................... 438/48–52, 689, 438/686, 678, 745, 753–754

(56) References Cited

U.S. PATENT DOCUMENTS 5,059,556 A * 10/1991 Wilcoxen .................... 438/52
5,164,339 A * 11/1992 Gimpelson ................... 438/52

* cited by examiner

Primary Examiner—Thanh Nguyen
(74) Attorney, Agent, or Firm—Wan Yee Cheung

(57) ABSTRACT

A method for protecting a material of a microstructure comprising said material and a noble metal layer against undesired galvanic etching during manufacture comprises forming on the structure a sacrificial metal layer having a lower redox potential than said material, the sacrificial metal layer being electrically connected to said noble metal layer.

12 Claims, 4 Drawing Sheets

FABRICATION OF SILICON MICRO MECHANICAL STRUCTURES

FIELD OF THE INVENTION

The present invention relates to silicon micro mechanical structures. More specifically, the invention relates to the fabrication of such structures using a wet etch operation. Still more specifically, the invention deals with the protection of such structures against undesired galvanic etching.

BACKGROUND OF THE INVENTION, PRIOR ART

Silicon is used in the semiconductor art to manufacture integrated circuits (ICs), especially for very large scale (VLSI) devices and the like. Many steps in the fabrication of such devices include a wet etch operation using aggressive etching fluids such as hydrofluoric acid (HF).

However, corrosion of silicon may occur when it is dipped in HF. In general, this effect is small, but it can be enhanced when the silicon is highly doped with elements such as Al, As, C, Ga, P, Sb and the like, as is normally the case with silicon used for the manufacture of VLSI modules. Corrosion of silicon may also be enhanced in the presence of ultraviolet (UV) light or with the anodic polarization of silicon structures by an external potential.

Examples of silicon etching in HF solutions are the corrosion of highly doped silicon structures in the presence of UV light as used to detect the junction depth of a pn diode, silicon electropolishing and porous silicon fabrication.

Such corrosion may also be enhanced without the use of an external voltage or illumination. If, in a device, some silicon part is electrically connected with noble metals, e.g., gold wires, a galvanic cell is formed when the device is dipped in HF solution with a potential large enough to significantly etch the silicon parts. In this configuration, the noble metal plays the role of the cathode and the silicon functions as the anode. Reduction of protons to hydrogen molecules takes place at the cathode and silicon etching will result. This etching of silicon increases with the acidity of the solution because more protons are available in more acidic solutions.

The formation of a galvanic cell in a HF solution is illustrated in FIG. 1 using silicon and gold as the anode and cathode, respectively. The figure shows the variation of current (log i) with voltage (V). The corrosion potential between silicon n+ and gold is shown as the point of intersection of the two curves representing the Si n+ current (anode side) and the gold current (cathode side). The redox potential of silicon surface depends its react chemical composition. Different dopant types and concentrations (n, $n^+$, p, $p^+$) oxidize with different rates and therefore give different currents.

In many silicon ElectroMechanical MicroSystems (MEMS) devices, such as chemical sensors, micromechanical devices and integrated optical elements, a combination of noble metal wiring and silicon is commonly used. Noble metals are used in MEMS fabrication to produce free standing structures using an relatively aggressive etching solutions such as Potassium Hydroxide. Standard metals like Al would be etched away by such solutions. It is to be noted that wiring must be done before the structure production because processing is much more difficult thereafter.

Silicon oxide films are extensively used in such devices as electrical isolation layers, passivation, or as a masking film. To pattern these films or to remove them at the end of a process, HF based solutions are efficient and widely used wet etching solutions.

When the noble metal and the silicon parts are electrically connected in the presence of HF, the silicon may be corroded galvanically. To avoid such an undesired effect, the straight forward solution would be to protect either the noble metal or the silicon or both during the HF etch. However, in many MEMS devices, such protection is not always possible. Examples of such MEMS devices include devices having free standing structures which limit the deposition and the patterning of protective films.

Another known technique is to inhibit any silicon etching with a cathodic polarization of the silicon by applying a voltage between the silicon structure and the metal part. However, in order to apply such a technique, all the metal and silicon structures must be connected together to two contact zones in order to apply a potential. This may be a problem for devices with many isolated structures, because this would require very complicated and space consuming additional wiring. As is clear to the skilled worker, this would also incur an additional etch step in an already complex process to remove the extra wiring after the device is completed.

It would be desirable to provide a method for protecting silicon micro mechanical structures against undesired galvanic etching that overcomes the above mentioned drawbacks of the state of the art. It would also be desirable for such a method that can be easily incorporated into existing processes.

SUMMARY OF THE INVENTION

In accordance with the present invention, there is now provided a method for protecting a material of a microstructure against undesired galvanic etching during manufacture, said structure comprising said material and a noble metal layer, the method comprising forming on the structure a sacrificial metal layer having a lower redox potential than said material, the sacrificial metal layer being electrically connected to said noble metal layer.

The present invention advantageously provides a method for protecting silicon micro mechanical structures against undesired galvanic etching that overcomes the above mentioned drawbacks of the state of the art. Such a method can be easily incorporated into existing processes.

The sacrificial metal layer may be formed of aluminum. The material may comprise silicon. A preferred embodiment of the present invention comprises forming the sacrificial metal layer on one side of said structure and is subsequently connected to said noble metal layer. The sacrificial metal layer may be formed on the noble metal layer. The sacrificial metal layer may be removed with an etch solution after fabrication of the micro structure. The sacrificial metal layer may be left on said micro structure after fabrication thereof. The sacrificial metal layer may be formed in a plurality of pads each connected to a different part of the noble metal layer.

Viewing the present invention from another aspect, there is now provided a microstructure comprising: a material; a noble metal layer; and, a sacrificial metal layer electrically connected to the noble metal layer and having a lower redox potential than the material.

BRIEF DESCRIPTION OF THE DRAWINGS

Preferred embodiments of the present invention will be described shortly, by way of example only, with reference to the accompanying drawings, in which.

DETAILED DESCRIPTION OF THE PREFERRED EMBODIMENT

In a preferred embodiment of the present invention there is provided a new way to protect silicon against unwanted galvanic etching. Although the invention is applicable to different etching solutions, it will hereinafter be described with respect to an HF etch solution only.

Figure 1:
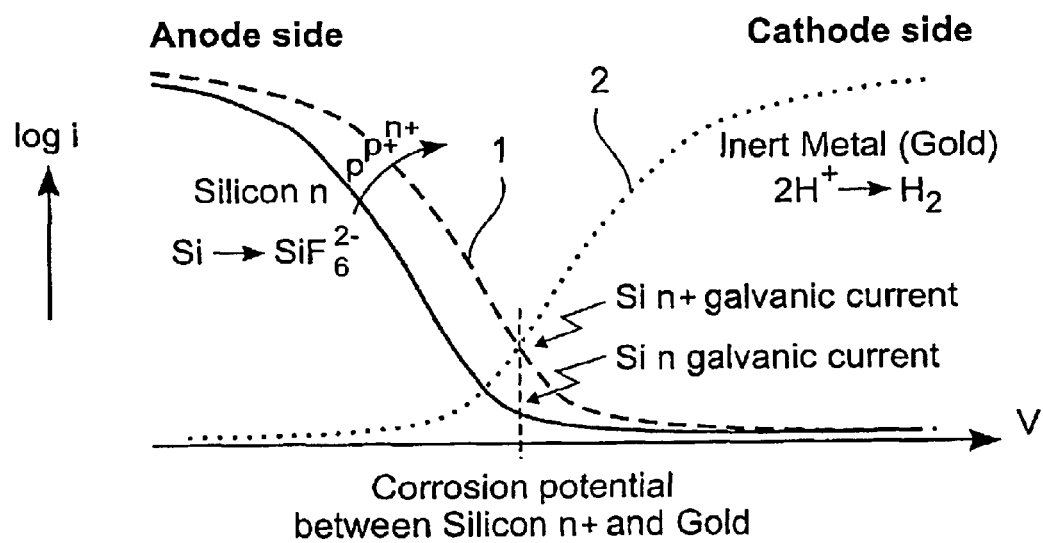
FIG. 1 is a graph showing the variation of current with voltage between silicon and gold in HF solution.

As mentioned previously, the formation of a galvanic cell in a HF solution is illustrated in FIG. 1 using silicon and gold as the anode and cathode, respectively. FIG. 1 shows the variation of current (log i) with voltage (V). The corrosion potential between silicon n+ and gold is shown as the point of intersection of the two curves representing the Si n+current (curve 1, anode side) and the gold current (curve 2, cathode side)

The protection is achieved based on a cathodic protection of the silicon with a sacrificial layer forming an integrated anodic electrode. By the deposition of a sacrificial layer having a lower redox potential than silicon and being electrically connected to the noble metal used, the corrosion potential is shifted to a voltage where the silicon current corrosion is negligible.

Figure 2:
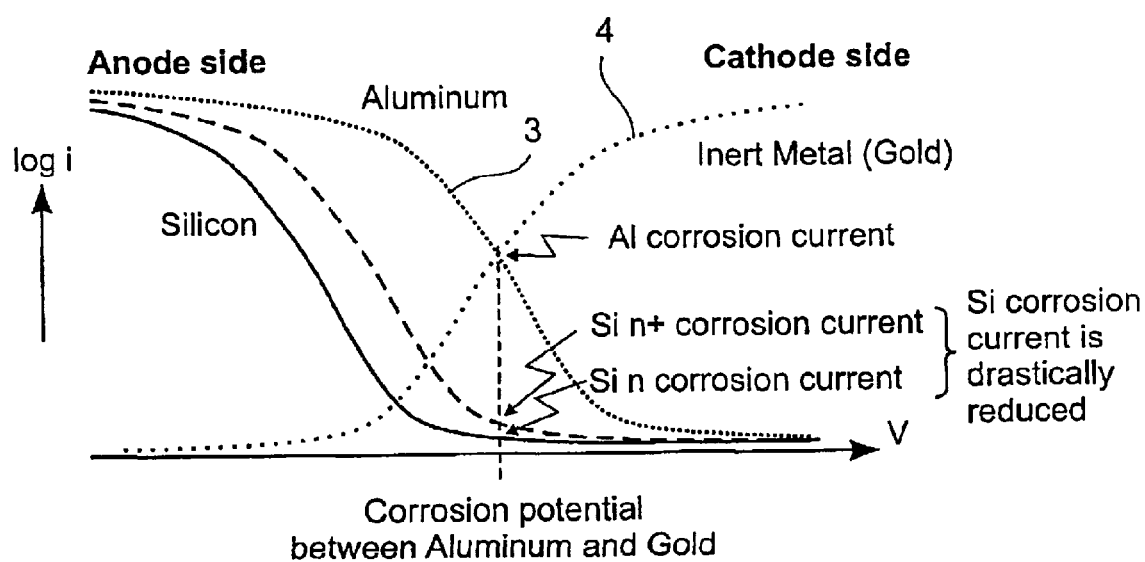
FIG. 2 is a graph showing the same type of variation as shown in FIG. 1 but with the method according to the invention.

This effect is illustrated in FIG. 2, which shows the formation of a galvanic cell in a HF solution using aluminum and gold as the anode and cathode, respectively. In contrast to the galvanic cell of FIG. 1, an additional aluminum pad has been connected as an integrated anodic electrode. The corrosion is defined by the intersection of the two curves representing the aluminum corrosion current (curve 3, anode side) and the gold current (curve 4, cathode side). The corrosion potential is fixed by the Al-Au cell and at this potential the silicon corrosion current is low.

As can be seen from FIG. 2, the silicon corrosion current is drastically reduced by shifting the corrosion potential to higher values of log i. It will be appreciated that "Si n+ galvanic current" in FIG. 1 and "Si n+ corrosion current" in FIG. 2 refer to the same. Al is a preferred material for shifting the corrosion potential because it has a relatively low redox potential. However, other materials, such as Cr, Zn, and Mg may also be employed.

In general, to protect a material A which is electrically connected to a material B (where the redox potential of A<than B) against corrosion while deep in a solution (electrolyte), a material C having a lower redox potential than A should be attached to B.

The materials with the lower and higher redox potential define the corrosion potential and from this potential the corrosion current of all other materials connected to them. This is why the silicon corrosion current reduced when the respective corrosion potential is shifted to higher values of log i.

This cathodic protection by applying a sacrificial layer of a metal acting as an integrated anodic electrode has the advantage that there is no need to embed or otherwise encapsulate the structure to protect it against HF solution attack and that no additional wiring is needed.

The only thing that needs to be done is adding a pad layer or film of a sacrificial material to the structure. The sacrificial material can be either placed on a side of the structure to be protected and then connected to the noble metal, or it can be applied on top of the structure, thus saving space. The sacrificial pad should have an large enough area in contact with the etching solution, in order that its efficiency is not limited by the maximum current density at the etching solution/sacrificial pad interface.

Once the etch is done, there remains a part of the sacrificial material layer which can be etched away using an appropriate etch solution or can be left as it is. However, in the last case, the remaining sacrificial layer, should not shortcut functional electrical connection. For that purpose, the sacrificial film should be structured so as to avoid shortcut. For example, the sacrificial layer can be deposited just after the deposition of the noble metal layer and structured at the same time.

Figure 3:
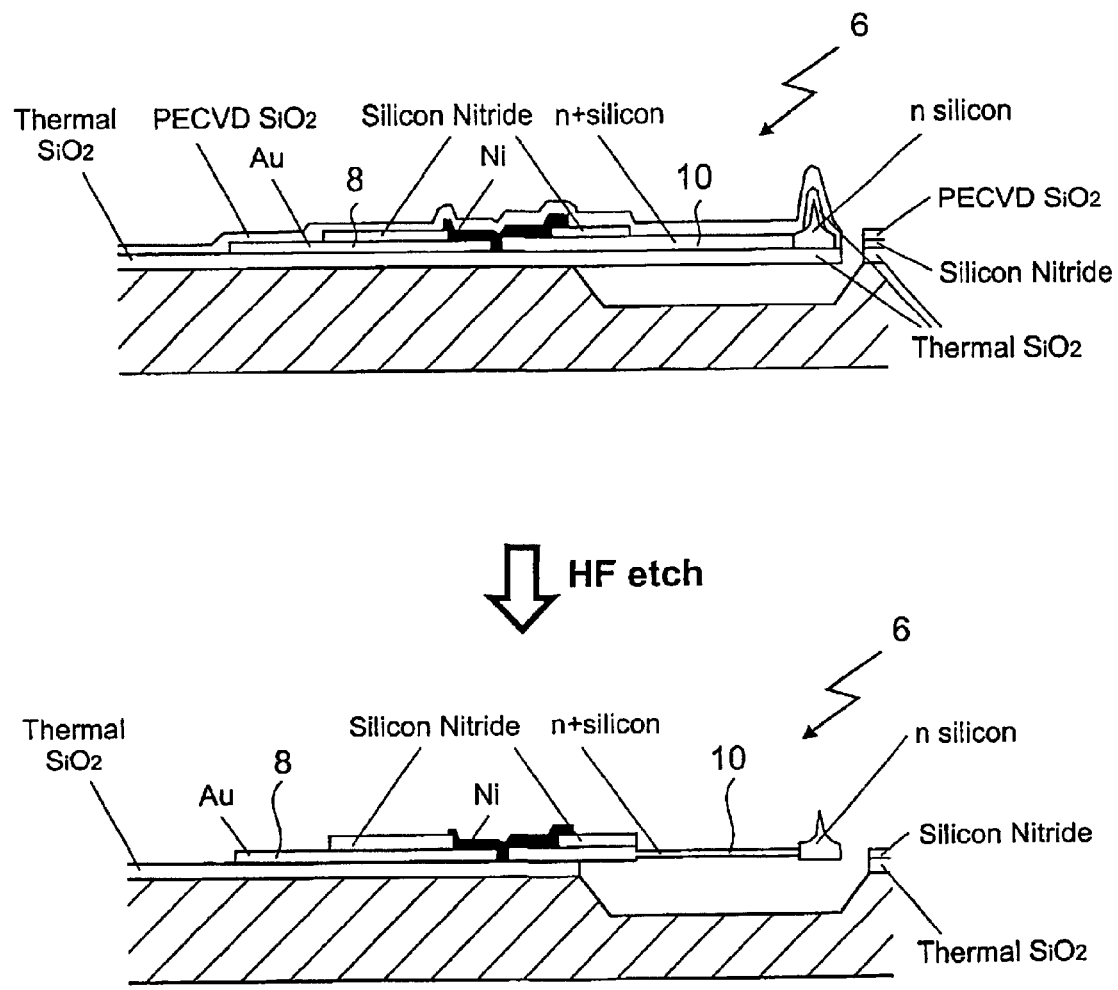
FIG. 3 schematically shows a cantilever manufactured according to the state of the art.
Figure 4:
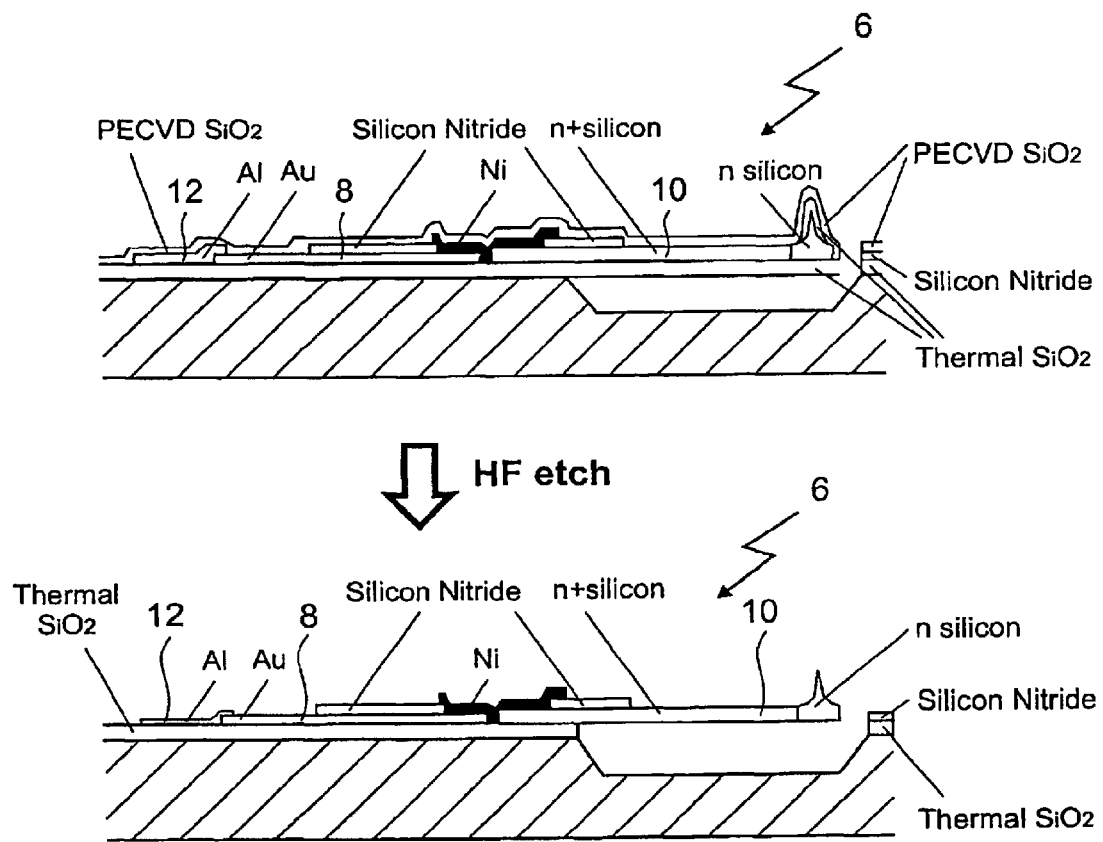
FIG. 4 schematically depicts a cantilever manufactured according to the present invention.

FIGS. 3 and 4 show the application of the present invention to the manufacture of a cantilever/tip structure 6 for use in magnetic storage technology. Here, gold wiring 8 is connected to the highly doped silicon cantilever 10, and, at the end of the manufacturing process, a final HF-based etch is needed to remove all the silicon oxide protection present, in particular the highly doped part. In FIG. 3, no additional sacrificial aluminum pad has been added and it can be seen that after the HF etch, the silicon cantilever 6 is corroded, whereas FIG. 4 shows that, when using an additional aluminum layer 12 connected to the gold wiring 8, no visible corrosion occurs.

In an example of the present invention herein before described, a sacrificial aluminum layer is applied to act as an integrated anodic electrode. However, it will be appreciated that the present invention can be used universally as a complementary tool in integrated system fabrication as a protection against undesired galvanic etching. Different types of galvanic cells may be formed with different material and etch solutions. The present invention is especially although by no means exclusively attractive for use in MEMS applications because it overcomes the difficulties associated with the conventional protection techniques as explained above. The present invention is also applicable to CMOS applications where industry trends towards copper wiring (which has a high oxidoreduction potential) and silicon on insulator wafer (where basically the transistors are completely isolated) incur galvanic wet etching problems.

The present invention is also desirable where MEMS devices are integrated with microelectronic circuits, such as in emerging RF mechanical filter designs.

The present invention is attractive for porous silicon applications because it adds more flexibility to the fabrication of porous and non porous zones independent of the silicon doping type and concentration.

What is claimed is:

1. A method for protecting a material of a structure against undesired galvanic etching during manufacture, said structure comprising said material and a noble metal layer, the method comprising forming on the structure a sacrificial metal layer having a lower redox potential than said material, the sacrificial metal layer being electrically connected to said noble metal layer.

2. A method according to claim 1, wherein the sacrificial metal layer is formed of aluminum.

3. A method according to claim 2, comprising forming said sacrificial metal layer on one side of said structure and connecting said sacrificial metal layer to said noble metal layer.

4. A method according to claim 2, comprising forming said sacrificial metal layer on said noble metal layer.

5. A method according to claim 1, wherein said material comprises silicon.

6. A method according to claim 5, comprising forming said sacrificial metal layer on one side of said structure and connecting said sacrificial metal layer to said noble metal layer.

7. A method according to claim 5, comprising forming said sacrificial metal layer on said noble metal layer.

8. A method according to claim 1, comprising forming the sacrificial metal layer on one side of said structure and is subsequently connected to said noble metal layer.

9. A method according to claim 1, comprising forming the sacrificial metal layer on the noble metal layer.

10. A method according to claim 1, comprising removing the sacrificial metal layer with an etch solution after fabrication of the structure.

11. A method according to claim 1, comprising leaving the sacrificial metal layer on said structure after fabrication thereof.

12. A method according to claim 11, comprising forming the sacrificial metal layer in a plurality of pads each connected to a different part of the noble metal layer.

* * * * *